United States Patent [19]
Li et al.

[11] Patent Number: 5,487,356
[45] Date of Patent: Jan. 30, 1996

[54] CHEMICAL VAPOR DEPOSITION METHOD OF GROWING OXIDE FILMS WITH GIANT MAGNETORESISTANCE

[75] Inventors: Yi-Oun Li; Jiming Zhang, both of Danbury, Conn.

[73] Assignee: Advanced Technology Materials, Inc., Danbury, Conn.

[21] Appl. No.: 345,317

[22] Filed: Nov. 28, 1994

Related U.S. Application Data

[63] Continuation-in-part of Ser. No. 280,143, Jul. 25, 1994, which is a continuation of Ser. No. 927,134, Aug. 7, 1992, abandoned.

[51] Int. Cl.$^6$ .................................................. C30B 23/08
[52] U.S. Cl. ......................... 117/99; 117/103; 117/104; 117/944
[58] Field of Search .................................. 117/104, 103, 117/99, 944

[56] References Cited

U.S. PATENT DOCUMENTS

| | | | |
|---|---|---|---|
| 4,937,152 | 6/1990 | Sato et al. | 429/30 |
| 5,045,169 | 9/1991 | Feduska et al. | 204/258 |
| 5,049,458 | 9/1991 | Sato et al. | 429/32 |
| 5,204,314 | 4/1993 | Kirlin et al. | 505/1 |
| 5,225,561 | 7/1993 | Kirlin et al. | 546/256 |

OTHER PUBLICATIONS

"Giant Negative Magnetoresistance in Perovskite–like La$_{2/3}$Ba$_{1/3}$MnO$_x$ Ferromagnetic Film." von Helmolt et al., Phys. Rev. Lett. 71, 2331–3 (1993).

"Plasma Enhanced Metalorganic Chemical Vapor Deposition of Conductive Oxide Electrodes for Ferroelectric BaTiO$_3$ Capacitors." Zhang et al., MRS Symp Proc 310 pp. 249–254 (1993).

"Metal Organic Chemical Vapor Deposition of LaSrCoO Electrodes for Ferroelectric Capacitors." Zhang et al., 6th ISAF Conf., Mar. 1994.

"Magnetoresistance in magnetic manganese oxide with intrinsic antiferromagnetic spin structure." Chahara et al., Appl. Phys. Lett. 63, 1990–2 (1993).

Von Helmolt et al, "Intrinsic Giant Magnetoresistance of Mixed Valence La–A–Mn Oxide", J. Applied Physics vol. 76(10), Nov. 15, 1994 pp. 6925–6928.

Primary Examiner—Robert Kunemund
Attorney, Agent, or Firm—Janet Elliott

[57] ABSTRACT

A chemical vapor deposition method for forming films or coatings of metal oxide films showing a giant magnetoresistive effect, with the metal oxides having the formula La$_x$A$_{1-x}$MnO$_3$ wherein A is selected from the group consisting of barium, calcium, manganese, and strontium, and x is a number in the range of from 0.2 to 0.4. The method uses a liquid source delivery CVD approach, wherein source reagent solution precursor is flash vaporized and is delivered to a CVD chamber, wherein it decomposes to deposit the multicomponent metal oxide films with well-controlled stoichiometry.

10 Claims, 3 Drawing Sheets

CHEMICAL VAPOR DEPOSITION METHOD OF GROWING OXIDE FILMS WITH GIANT MAGNETORESISTANCE

CROSS-REFERENCE TO RELATED APPLICATIONS

This is a continuation-in-part of U.S. application Ser. No. 08/280,143 filed Jul. 25, 1994, in the names of Peter S. Kirlin, Robin L. Binder, Robin A. Gardiner, Peter Van Buskirk, Jiming Zhang, and Gregory Stauf, which is a continuation of U.S. patent application Ser. No. 07/927,134, now abandoned, filed Aug. 7, 1992 in the same names.

BACKGROUND OF THE INVENTION

1. Field of the Invention

This invention relates to a chemical vapor deposition method for forming films or coatings of metal oxide films showing a giant magnetoresistive effect.

2. Description of the Related Art

When a conductor carrying current is placed in a magnetic field, its resistance changes. This change is called its magnetoresistance and is denoted $\Delta R/R_H = (R_O - R_H)/R_H$, and may be either plus or minus. The magnetoresistive effect has been used in a number of sensing and measuring devices. Typically these devices use a magnetic material, often a film, as the magnetoresistive element since magnetic materials can have large internal fields for small applied fields. Examples of magnetoresistive devices are magnetic bubble domain sensors, and position and angle sensors in automobiles.

A giant magnetoresistance (GMR) effect was first observed in Fe/Cr multilayers, and subsequently in many other metallic multilayers (e.g. Co/Cu, Fe/Cu), and sandwiches (e.g., Co/Au/Co). At room temperature, mamagnetoresistance changes as high as 40% have been observed in these multilayers, compared to only 2–3% for normal ferromagnetic materials such as permoalloys. A similar GMR effect was also observed in heterogeneous metastable alloys such as Cu—Co, Ag—Co and Fe—Cu. Recently, the magnitude of the GMR effect that is available has been increased dramatically by the use of certain oxide materials. A thousand fold magnetoresistance change has been reported in magnetic manganese oxide films grown epitaxially on LaAlO$_3$ substrates by laser ablation.

Potential commercial applications of films of GMR materials are in magnetic sensors, magnetoresistive read heads, and magnetoresistive random access memories, where they offer significant advantages over conventional magnetic materials. However, several problems in the earlier known metallic multilayer and metastable alloy GMR materials persist. The most serious one is the higher magnetic drive fields required to observe the effect, typically in the several hundred to several thousand Ørsteds (Oe); the required sensitivity range for many applications lies in the range of 10 to 100 Oe. Other limitations include low sheet resistivity and poor thermal stability. The new oxide GMR materials, which are based on manganese oxides, may overcome these problems.

The new manganese oxide-based GMR materials have formula:

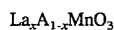

$$La_xA_{1-x}MnO_3$$

wherein A is selected from the group consisting of barium, calcium, and strontium, and x is a number in the range of from 0.2 to 0.4. The magnetic manganese oxide $(La_{1-x}A_x)MnO_3$, where A represents Ca, Sr, or Ba, has a perovskite-type crystal structure with ferromagnetic ordering in the a-b planes and antiferromagetic ordering along the c-axis below the Néel temperature. The ferromagnetically ordered Mn-O layers of the a-b planes are separated by a nonmagnetic La(A)-O monolayers. This spin structure is intrinsic, and is similar to that of the metallic multilayers described above which exhibited GMR.

$(La_{1-x}A_x)MnO_3$ compounds having the extreme values x=0,1 are neither ferromagnetic nor good electrical conductors; they are semiconductors. Only compounds with intermediate values of x are ferromagnetic, with the strongest ferromagnetism occurring in the range 0.2<x<0.4. Within this same range, the electrical conductivity is high. At 100 K the conductivity decreases by a factor of 0.01 as x is decreased to 0.1 or below or increased to 0.6 or above. This result has been explained on the basis of the mixed $Mn^{+3}$-$Mn^{+4}$ valence state in this compound. In the extreme composition LaMnO$_3$, each metal atom is triply charged. However, if one replaces some of the La atoms by divalent atoms such as Ca, Sr, or Ba, a corresponding number of Mn atoms becomes quadruply charged.

Because of the GMR effect depends strongly on composition, the ability to use the oxide GMR films in sensors and other devices where consistency is important will depend on the ability to control the stoichiometry of the deposited films. In addition to the dependence on the mole ratio of lanthanum to Group II metal, the GMR properties depend on the amount of oxygen present in the films. Therefore, a successful deposition method will require good control of all aspects of stoichiometry. In addition, a desirable deposition method should be capable of being scaled up, should integrate into current electronic device manufacturing technology, and should not require temperatures so high that they are incompatible with other materials present in the devices.

$La_xA_{1-x}MnO_3$ films have been deposited by physical vapor deposition methods such as sputtering and laser ablation. $(La_xBa_{1-x})MnO_z$ thin films prepared by laser ablation showed $\Delta R/R_H = (R_O - R_H)R_H$ as large as $-150\%$ at room temperature. Sputtered $(La_{0.72}Ca_{0.25})MnO_3$ ((LaCa)MnO3) films on MgO substrates gave $\Delta R/R_H$ values of $-110\%$ at 220 K but 0% at room temperature. The $\Delta R/R_H$ of laser deposited $(La_{0.72}Ca_{0.25})MnO_z$ films on LaAlO$_3$ substrates was improved to $-500\%$ at 100 K but again was 0% at room temperature. Annealing these samples in oxygen enhanced their $\Delta R/R_H$ value to $-100,000\%$ near 77 K, $-1500\%$ at 190 K and $-400\%$ at 280 K. It has also been reported that films deposited at higher oxygen partial pressures (300 mTorr) have a higher $\Delta R/R_H$ near room temperature.

Chemical vapor deposition (CVD) is a particularly attractive method for forming these layers because it is readily scaled up to production runs and because the electronics industry has a wide experience and an established equipment base in the use of CVD technology which can be applied to new CVD processes. In general, the control of key variables such as oxygen partial pressure during deposition, film stoichiometry and film thickness, and the coating of a wide variety of substrate geometries is most feasible with CVD. Forming the thin films by CVD will permit the integration of these materials into existing device production technologies. CVD also permits the formation of layers of the refractory materials that are epitaxially related to substrates having close crystal structures.

The use of CVD to form films showing the GMR effect has not previously been reported. The advantages of CVD in regard to scale-up and manufacturability of the $La_xA_{1-x}MnO_3$ GMR films are so attractive that development of a CVD method is an important goal in the commercialization of devices using the GMR effect. Such CVD films would desirably have high GMR effects, comparable to or greater than effects observed in prior art films.

CVD requires that the element source reagents must be sufficiently volatile to permit gas phase transport into the deposition reactor. The element source reagent must decompose in the reactor to deposit only the desired element or its oxide at the desired growth temperatures. Premature gas phase reactions leading to particulate formation must not occur, nor should the source reagent decompose in the lines before reaching the reactor deposition chamber. When compounds are to be deposited, obtaining optimal properties requires close control of stoichiometry which can be achieved if the reagents can be delivered into the reactor in a controllable fashion. In addition, the reagents must not be so chemically stable that they do not react in the deposition chamber.

Thus a desirable CVD reagent is fairly reactive and volatile. Many potentially highly useful refractory materials have in common that one or more of their components are elements, such as the Group II metals barium, calcium, or strontium, or early transition metals zirconium or hafnium, for which few volatile compounds well-suited for CVD are known. In many cases, the source reagents are solids whose sublimation temperature may be very close to the decomposition temperature, in which case the reagent may begin to decompose in the lines before reaching the reactor, and it will be very difficult to control the stoichiometry of the deposited films.

In other cases, the CVD reagents are liquids, but their delivery into the CVD reactor in the vapor phase has proven problematic because of problems of premature decomposition or stoichiometry control.

The problem of controlled delivery of CVD reagents into deposition reactors was addressed by the inventors in U.S. Pat. No. 5,204,314 "Method for Delivering an Involatile Reagent in Vapor Form to a CVD Reactor," and further elaborated in U.S. patent application Ser. No. 08/280,143, "Apparatus and Method for Delivery of Involatile Reagents," which hereby are incorporated herein by reference. As described and claimed in these patents, the delivery of reagents into the deposition chamber in vapor form is accomplished by providing the reagent in a liquid form, as a neat liquid or solution of a solid or a liquid compound, and flowing the reagent liquid onto a flash vaporization matrix structure which is heated to a temperature sufficient to flash vaporize the reagent source liquid. A carrier gas may optionally be flowed by the flash vaporization matrix structure to form a carrier gas mixture containing the flash vaporized reagent.

Upon heating the ensemble of reagents to vaporize and deliver them to the reactor or under the high temperature conditions present in the CVD reactor, the various metal complexes may undergo ligand exchange reactions. If the products of such ligand exchange reactions are involatile, the result may be premature nucleation and formation of particulate species in the reactor, in the lines leading from the source reservoir(s) to the reactor, or in the source reservoir itself, if more than one reagent is held in the same reservoir. Thus stability to ligand exchange reactions in the solvent/reagent system of choice is an important consideration. For CVD of multicomponent oxide materials, compatibility of the reagents requires resistance to ligand exchange reactions.

Therefore, the present invention seeks to provide source reagents, source reagent combinations, solution compositions and deposition conditions that when used with the liquid delivery method enable the reproducible chemical vapor deposition of $La_xA_{1-x}MnO_3$ GMR films.

Other objects and advantages of the present invention will be more fully apparent from the ensuing disclosure and appended claims.

SUMMARY OF THE INVENTION

In one aspect, the present invention relates to a chemical vapor deposition method for forming films or coatings of metal oxide films showing a giant magnetoresistive effect, with the metal oxides having the formula $La_xA_{1-x}MnO_3$ wherein A is selected from the group consisting of barium, calcium, manganese, and strontium, and x is a number in the range of from 0.2 to 0.4. The method comprises the steps of:

forming a single source reagent solution of metalorganic compounds B, C and D in an organic solvent medium for said metalorganic compounds, wherein:
B is a beta-diketonate or beta-ketoester adduct of lanthanum;
C is a beta-diketonate or beta-ketoester adduct of A; and
D is a beta-diketonate or beta-ketoester adduct of manganese;

wherein:
each of the B, C and D adducting ligands is the same as the others; and
the molar concentration of B in said source reagent solution is from 0.002 to 0.2 moles/liter of solution;
the molar concentration of C in said source reagent solution is from 0.002 to 0.2 moles/liter of solution; and
the molar concentration of D in said source reagent solution is from 0.01 to 0.5 moles/liter of solution;

vaporizing the source reagent solution to form a multicomponent vapor comprising B, C, and D;

directing the multicomponent vapor into a chemical vapor deposition reactor having a substrate disposed therein, for deposition of lanthanum, A, and manganese from the multicomponent vapor onto the substrate;

maintaining a generally constant pressure in the chemical vapor deposition reactor of oxidizing gas therein, wherein the oxidizing gas is selected from the group consisting of oxygen and $N_2O$; and maintaining the substrate at a temperature in the range of 600° C. to 700° C. during said deposition of lanthanum, A, and manganese from the multicomponent vapor onto the substrate.

In another aspect, the present invention relates to a chemical vapor deposition method for forming films or coatings of metal oxide films showing a giant magnetoresistive effect, with the metal oxides having the formula $La_xA_{1-x}MnO_3$ wherein A is selected from the group consisting of barium, calcium, manganese, and strontium, and x is a number in the range of from 0.2 to 4. The method comprises the steps of:

forming separate source reagent solutions for each of metalorganic compounds B, C and D respectively in organic solvent media for said metalorganic compounds, wherein:

B is a beta-diketonate or beta-ketoester adduct of lanthanum;

C is a beta-diketonate or beta-ketoester adduct of A; and

D is a beta-diketonate or beta-ketoester adduct of manganese;

wherein:

each of the B, C and D adducting ligands is the same as the others; and the molar concentration of B in said source reagent solution is from 0.01 to 0.5 moles/liter of solution;

the molar concentration of C in said source reagent solution is from 0.002 to 0.2 moles/liter of solution; and the molar concentration of D in said source reagent solution is from 0.01 to 0.2 moles/liter of solution;

vaporizing the source reagent solutions to form a multicomponent vapor comprising selected proportions of B, C, and D;

directing the multicomponent vapor into a chemical vapor deposition reactor having a substrate disposed therein, for deposition of lanthanum, A, and manganese from the multicomponent vapor onto the substrate;

maintaining a generally constant pressure in the chemical vapor deposition reactor of oxidizing gas therein, wherein the oxidizing gas is selected from the group consisting of oxygen and $N_2O$; and maintaining the substrate at a temperature in the range of 600° C. to 700° C. during said deposition of lanthanum, A, and manganese from the multicomponent vapor onto the substrate.

As used herein, the term "source reagent solution precursor" includes solutions comprising a single solvent medium containing compounds B, C, and D (i.e., a multicomponent solvent solution in which the solvent is solvatingly effective for each of the compounds B, C, and D), as well as solution precursor comprising a separate solvent solution for each of the compounds B, C, and D (in which the solvent in each case may be the same as or differ from solvent in the other solutions).

Other aspects and features of the invention will be more fully apparent from the ensuing disclosure and appended claims.

DETAILED DESCRIPTION OF THE INVENTION, AND PREFERRED EMBODIMENTS THEREOF

Figure 1:
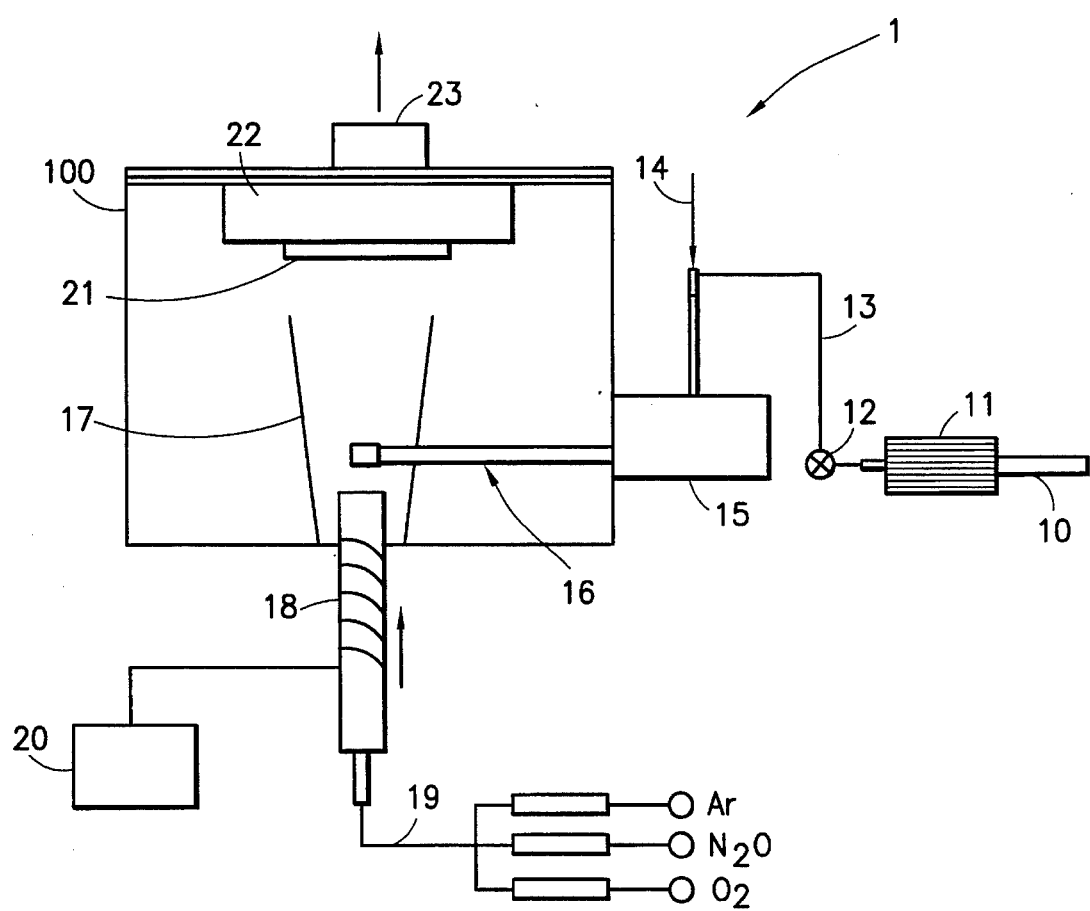
FIG. 1 shows a schematic of a liquid delivery system for CVD.

The source reagents that may be used in the practice of the present invention are typcially metal complexes wherein the same or similar ligands are utilized for each metal to prevent the deleterious effects of ligand exchange. Suitable ligands include beta-diketonates, beta-ketoesters, and derivatives of these materials that bind in a chelating fashion to the metal. Examples of suitable ligands include the beta-diketonates 2,2,6,6-tetramethyl-3,5-heptanedionate (thd), acetylacetonate (acac), hexafluoroacetylacetonate (hfacac), 2,2-dimethyl-6,6,7,7,8,8,8-heptafluoro-3,5-octanedionate (fod), and the like, ethyl 3-oxobutanoate, methyl 3-oxobutanoate, and similar compounds. The ligand should impart solubility in solvents that have appropriate volatility for use in the liquid delivery CVD method.

The reagents are dissolved in a solvent or a mixture of solvents chemically compatible with the source reagents. The solvent used for transport of the organometallics to the reactor must be capable of being volatilized at a temperature below the decomposition temperature of the precursor reagents and must be a good solvent for the reagents. Useful solvents include organic solvents that are good solvents for the source reagents, especially alcohols, ethers, and esters. Typical solute concentrations are in the range of 0.0.002–0.2M for the lanthanum source reagent (denoted "B"), with 0.02 to 0.06 preferred; 0.002 to 0.2 M total for the Group II (barium, calcium, strontium) source reagents (denoted "C"), with 0.005 to 0.02 preferred; and 0.01 to 0.5M for the manganese source reagent (denoted "D"), with 0.04 to 0.08 preferred.

The source reagent solution can additionally comprise one or more complexing components, in a mole ratio of 1:1 or greater to the source reagent compound, to aid in increasing the volatility of the source reagents and facilitating their transport from the reagent solution reservoir(s) into the CVD reactor. Such complexing components include compounds with one or more Lewis base atoms that coordinate to the metal centers of the source reagents, for example tetraglyme, diglyme, bipyridine, tetrahydrofuran, 18-crown-6 ethers, and polyamines. Of these, tetraglyme is most preferred. Such complexing components and their use with source reagents are more fully described in U.S. Pat. No. 5,225,561, "Source Reagent Compounds for MOCVD of Refractory Films Containing Group IIA Elements."

If the source reagents are prepared as a single solution, which has advantages in practice in terms of reproducibility of the film stoichiometry, then the concentration ratios in the liquid can be the same as the desired film stoichiometry, although in general the characteristics of a specific CVD reactor (temperature, pressure, flow, presence of radicals) may require different cation ratios in the precursor liquid to obtain a desired film stoichiometry. Such determination is made empirically by CVD practitioners, with typically just a few model CVD runs.

Solutions of the source reagents may alternatively be prepared and used separately, as taught in U.S. Pat. No. 5,204,314, in which case be modulating the delivery rates of the various solutions, film stoichiometry can be controlled in a continuous or step-wise fashion.

Appropriate carrier gases include the inert gases, especially nitrogen or argon, as well as hydrogen.

The properties of the grown films are superior if they are grown under high pressures of oxidant species. Appropriate oxidant species include $O_2$ and $N_2O$. The oxidant gas can serve as the carrier gas for the source reagent solutions if desired.

Appropriate substrates for growth of GMR films must be chemically compatible with the manganese oxide materials of the GMR films and must be stable at temperatures, ambient atmosphere, and other conditions where the GMR film-based devices are used. From such materials, the preferred substrates are selected on the basis of compatible crystal structure, lattice parameter match, and closeness of the respective coefficients of thermal expansion. Especially suitable substrates and some of their pertinent properties are listed below, where "YSZ" denotes yttra-stabilized zirconia:

| Materials | Crystal structure | Lattice Parameter | Thermal Expansion Coefficient ($°C.^{-1} \times 10^{-6}$) | Lattice Mismatch |
|---|---|---|---|---|
| $LaAlO_3$ | Cubic | a = 3.792 | 12 | 1.98% |
| $LaGaO_3$ | Orthorhombic | a = 5.487 | 10.5 | 0.3% |
|  |  | b = 5.520 |  | 0.9% |
|  |  | c = 7.7525 |  | 0.16% |
| $NdGaO_3$ | Orthorhombic | a = 5.451 | 8 | 0.35% |
|  |  | b = 5.499 |  | 0.53% |
|  |  | c = 7.71 |  | 0.39% |
| YSZ | Cubic | a = 5.14–5.23 | 10 | 6.4–4.6% |
| MgO | Cubic | a = 4.213 | 13.5 | 29.8% |
| $Al_2O_3$ | Hexagonal | a1102 = 5.11 | 8.8 | 7% |
| $CeO_2$ | Cubic | a = b = c = 5.41 | 11.6 | 1.1% |

The substrate temperature during growth should be high enough to cause decomposition of the source reagents to deposit the films on the surface of the substrate, but not so high as to cause damage to the substrate itself, or to lead to irreproducible stoichiometries. Temperatures in the range of 600°–800° C. are preferred, and 650°–700° C. are most preferred.

The following table gives an example of a set of appropriate growth conditions:

| | |
|---|---|
| Substrate Temperature: | 650° C.–700° C. |
| Reactor pressure: | 1.5 Torr |
| Partial pressure of oxidant gas: | 1.2 Torr |
| Vaporizer temperature: | 220° C. |
| Carrier gas flow rate: | 50 sccm |
| Oxidant gas flow rate: | 250 sccm ($N_2O$) |
|  | 500 sccm ($O_2$) |
| Pumping speed of precursor solution: | 1–2 cc/hr |
| Cooling rate after growth: | 10° C./min in $O_2$ pressure of 760 Torr |

Films may be grown under these or similar conditions, in a reactor configuration such as shown in FIG. 1. The CVD system 1 has a conduit 10 for flow of source reagent solution precursor by means of a pump 11 through valve 12 and fluid flow conduit 13 to a vaporizor 15, where the source reagent solution precursor is flash vaporized. Carrier gas may optionally be flowed into conduit 13 at the juncture 14. After vaporization, the source reagent solution precursor flows into the CVD chamber 100 via the reagent injector 16. Chimney 17 optimizes flows within the chamber. In this configuration, the oxidant gases as well as a carrier gas may be flowed into the chamber in desired proportions via fluid flow conduit 19. An optional aspect of the CVD method is the use of plasma enhancement. If it is desired to use a plasma, such is created using coils 18, driven by RF generator 20. The substrate 21 is mounted on heater 22, which heats it to the desired temperature for deposition, and later can controllably decrease the substrate's temperature during cool-down, which helps to optimize the grown film's properties. Exhaust 23 draws out the unreacted source reagent solution precursor as well as by-products and any carrier or oxidant gases.

Many CVD configurations and reactor designs are known to those skilled in the chemical vapor deposition art. The method of the present invention can be used in a large variety of configurations, not intended to be limited by the exemplary set-up shown in FIG. 1.

The properties of the grown films can be improved by post-growth annealing in an oxidizing atmosphere. For example, annealing under oxygen at 1 atm pressure improved the properties of $La_xCa_{1-x}MnO_3$ films grown on $LaAlO_3$ substrates.

Films grown by CVD generally show good properties. The $La_xCa_{1-x}MnO_3$ films exhibit black and mirror-like surfaces. Scanning electron micrograph indicates that the films are polycrystalline with a grain size of about 1000 to 2000Å.

Figure 2:
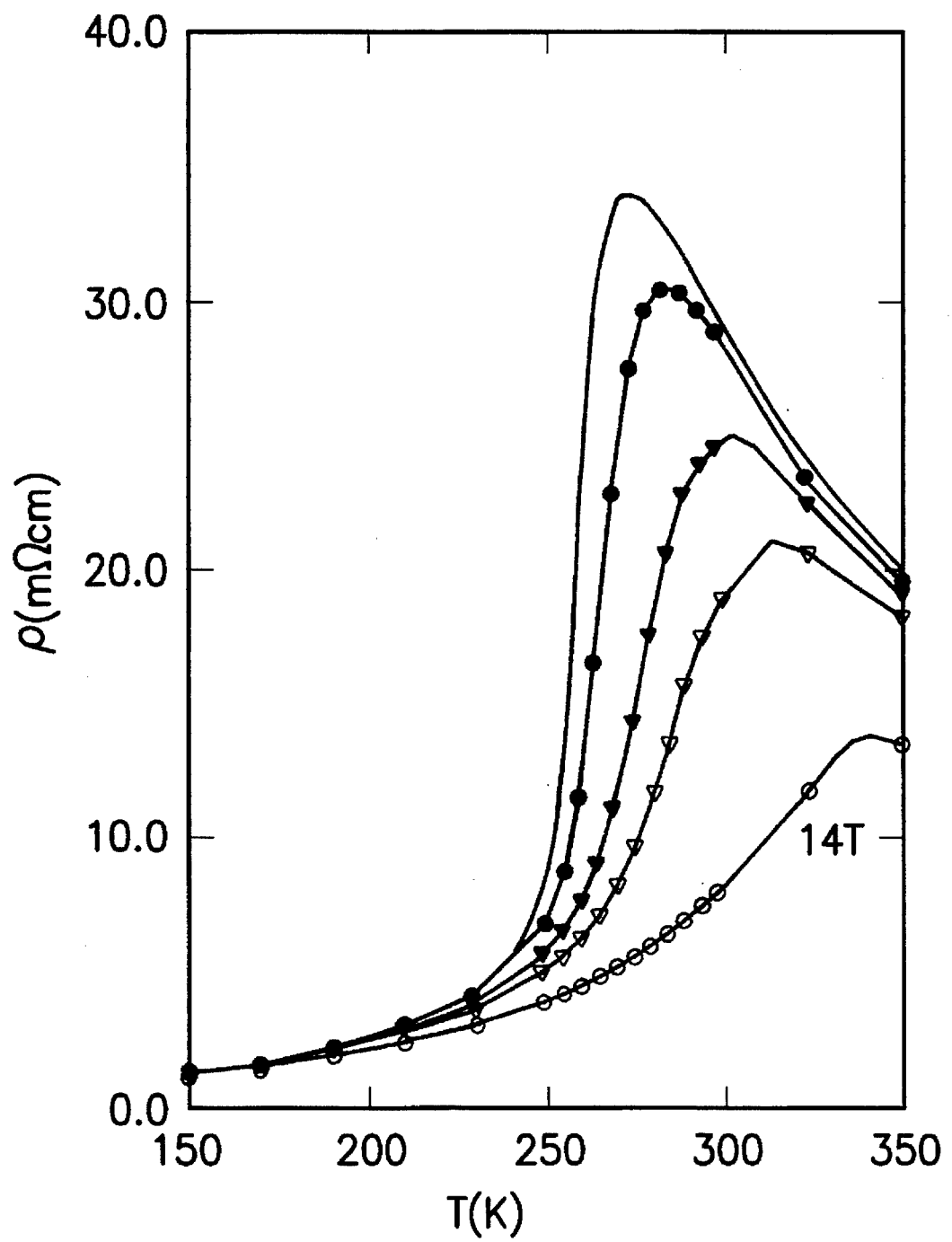
FIG. 2 shows the resistivity versus temperature for various magnetic fields ranging from 0 to 14 Tesla for an as-deposited (La,Ca)$MnO_3$ film grown on a $LaAlO_3$ substrate; the largest MR change is observed at the transition temperature $T_c$~270 K.
Figure 3:
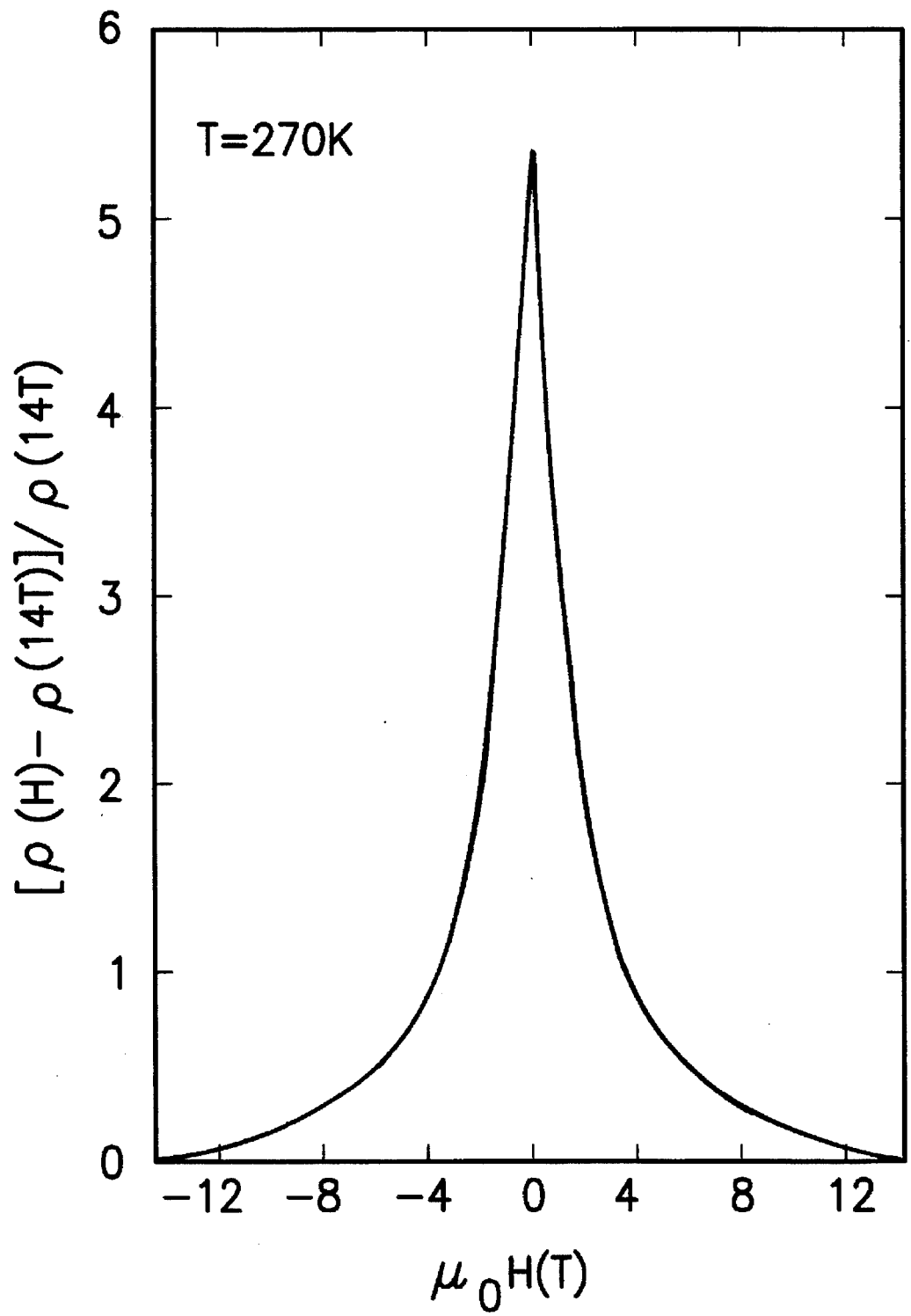
FIG. 3 shows the fractional change in resistivity, measured near the transition temperature, versus magnetic field for an as-deposited (La,Ca)$MnO_3$ thin film prepared by single-liquid-source metalorganic chemical vapor deposition on a $LaAlO_3$ substrate.

GMR effects in the CVD-grown films are substantial. FIG. 2 shows the resistivity $\rho$ versus temperature in the range 150–300 K for various magnetic fields ranging from 0 to 14 Tesla for an as-deposited $(La,Ca)MnO_3$ film that was prepared by single-liquid-source metalorganic chemical vapor deposition on a $LaAlO_3$ substrate; the largest MR change was observed at the transition temperature $T_c\sim270$ K. FIG. 3 shows the fractional change in resistivity $\rho$, film. The largest change of $\rho(\sim20\%$ at 1 Tesla) occurs in the vicinity of $T_c$. However, even at 300 K, a 14 T field suppresses $\rho$ by 30%.

The features and advantages of the invention are more fully illustrated by the following non-limited examples, wherein all parts and percentages are by weight, unless otherwise expressly stated.

EXAMPLE Growth of GMR Oxide Films on (100) $LaAlO_3$, (110) $NdGaO_3$, and (100)MgO Substrates by CVD $La_xCa_{1-x}MnO_3$ films were grown on (100) $LaAlO_3$, (110)$GaO_3$, and (100)MgO substrates by CVD in the CVD system that is shown schematically in FIG. 1. Tris(tetramethylheptanedionato)lanthanum ($La(thd)_3$), bis(tetramethylheptanedionato)calcium ($Ca(thd)_2$), and tris(tetramethylheptanedionato)manganese ($Mn(thd)_3$), all of which were purchased commercially (Strem Chemicals), were used as precursor materials. These three organic compounds, in appropriate amounts, were mixed and dissolved in a single organic solution under an inert atmosphere. The mole concentrations of $La(thd)_3$, $Ca(thd)_2$ and $Mn(thd)_3$ in the single solution were 0.033, 0.017, and 0.05, respectively. During deposition, the solution was constantly injected into a vaporizer by a liquid pump and the vapors were carried immediately into a chemical vapor deposition reactor by nitrogen gas. The films were deposited at a constant pressure of 1.5 Torr and at a substrate temperature ranging from 600° C. to 700° C. Both oxygen and nitrous oxide were used as oxidants.

The films were characterized and showed a high transition temperature $T_c$ in the as-deposited films, probably due to the higher oxygen partial pressure in the CVD process. The highest $T_c$ attained was 300 K. The peak value of resistivity $\rho$ is observed to decrease from 34 mΩ-cm to 12 mΩ-cm in the film with $T_c=300$ K. Post annealing of these films in 1 atm of $O_2$ further reduced $\rho$ and increased $T_c$. The oxygen content plays an important role in controlling the carrier concentration. All of the films prepared at different substrate temperatures between 600°and 750° C. were highly (001) oriented. The grain size of films decreased as the substrate temperature decreased without a degradation of crystallinity determined by XRD in this temperature range. There was no correlation found between grain size and cusp temperature or magnetoresistance of the films. The preferred orientation of the films appear to affect on the temperature dependence of resistivity as shown in the case of a (LaCa)MnO3 film deposited on MgO substrate. A lower $\Delta P/R_H$ effect of as-deposited (LaCa)MnO3 films by MOCVD than that of annealed (LaCa)MnO3 films prepared by laser deposition is probably due to a relatively low resistivity of these MOCVD films. The 550% change in magnetoresistance of these films, however, is the highest reported to date for as-deposited (LaCa)MnO3 films at 270 K.

In conclusion highly (001) oriented (LaCa)MnO$_3$ thin films are successfully deposited on (100) LaAlO$_3$, (110) NdGaO$_3$, and (100) MgO substrates by CVD. At 270 K the films exhibited a magnetoresistance change $\Delta R/R_H$ of 200% in a field of 3 Tesla, 300% in a field of 6 Tesla and 550% in a field of 14 Tesla. Oxygen concentration in the films strongly affects on the transition temperature and resistivity of the films.

While the invention has been described herein with reference to specific aspects, features, and embodiments, it will be apparent that other variations, modifications, and embodiments are possible, and all such variations, modifications, and embodiments therefore are to be regarded as being within the spirit and scope of the invention.

What is claimed is:

1. A method of forming on a substrate a giant magnetoresistive (GMR) oxide material of the formula $La_xA_{1-x}MnO_3$ wherein:

A is selected from the group consisting of barium, calcium, and strontium; and x is a number in the range of from 0.2 to 0.4, said method comprising the steps of:

providing metalorganic compounds B, C and D in solution, as source reagent solution precursor for said GMR oxide material, wherein:

B is a beta-diketonate or beta-ketoester adduct of lanthanum;

C is a beta-diketonate or beta-ketoester adduct of A; and

D is a beta-diketonate or beta-ketoester adduct of manganese;

wherein:

each of the B, C and D adducting ligands is the same as the others; and the molar concentration of B in said source reagent solution is from 0.002 to 0.2 moles/liter of solution;

the molar concentration of C in said source reagent solution is from 0.002 to 0.2 moles/liter of solution; and the molar concentration of D in said source reagent solution is from 0.01 to 0.5 moles/liter of solution;

vaporizing the source reagent solution precursor to form a multicomponent vapor comprising B, C, and D;

directing the multicomponent vapor into a chemical vapor deposition reactor having a substrate disposed therein, for deposition of lanthanum, A, and manganese from the multicomponent vapor onto the substrate;

maintaining a generally constant pressure in the chemical vapor deposition reactor of oxidizing gas therein, wherein the oxidizing gas is selected from the group consisting of oxygen and $N_2O$; and maintaining the substrate at a temperature in the range of 600° C. to 700° C. during said deposition of lanthanum, A, and manganese from the multicomponent vapor onto the substrate.

2. A method according to claim 1, wherein:

B is tris(tetramethylheptanedionato)lanthanum;

C is bis(tetramethylheptanedionato)A; and

D is tris(tetramethylheptanedionato)manganese.

3. A method according to claim 1, wherein the substrate comprises a material selected from the group consisting of lanthanum aluminate, neodymium gallate, magnesium oxide, and silicon and combinations thereof.

4. A method according to claim 1, wherein the vaporization of the source reagent solution comprises flash vaporization thereof.

5. A method according to claim 1, wherein said source reagent solution precursor comprises a single solvent medium containing metalorganic B, C and D.

6. A method according to claim 1, wherein said source reagent solution precursor comprises a separate solvent solution for each of said compounds B, C, and D.

7. A method according to claim 1, wherein said source reagent solution further comprises a complexing component.

8. A method according to claim 7, wherein the complexing component is selected from the group consisting of tetraglyme, diglyme, bipyridine, tetrahydrofuran, 18-crown-6 ethers, and polyamines.

9. A method according to claim 1, wherein:

the molar concentration of B in said source reagent solution is from 0.02 to 0.06 moles/liter of solution;

the molar concentration of C in said source reagent solution is from 0.005 to 0.02 moles/liter of solution; and the molar concentration of D in said source reagent solution is from 0.04 to 0.08 moles/liter of solution.

10. A method according to claim 1, which additionally comprises plasma enhancement.

\* \* \* \* \*